United States Patent
Kim et al.

(10) Patent No.: US 10,003,001 B2
(45) Date of Patent: Jun. 19, 2018

(54) THERMOELECTRIC MODULE

(71) Applicant: Hyundai Motor Company, Seoul (KR)

(72) Inventors: Byung Wook Kim, Gyeonggi-do (KR); Kyong Hwa Song, Seoul (KR); Jin Woo Kwak, Gyeongsangbuk-do (KR); Gyungbok Kim, Seoul (KR); In Woong Lyo, Gyeonggi-do (KR); Han Saem Lee, Seoul (KR)

(73) Assignee: Hyundai Motor Company, Seoul (KR)

( * ) Notice: Subject to any disclaimer, the term of this patent is extended or adjusted under 35 U.S.C. 154(b) by 0 days. days.

(21) Appl. No.: 14/939,415

(22) Filed: Nov. 12, 2015

(65) Prior Publication Data

US 2017/0077377 A1    Mar. 16, 2017

(30) Foreign Application Priority Data

Sep. 10, 2015  (KR) .......................... 10-2015-0128440

(51) Int. Cl.
  *H01L 35/32* (2006.01)
  *H01L 35/10* (2006.01)
  *H01L 35/30* (2006.01)
(52) U.S. Cl.
  CPC .............. *H01L 35/32* (2013.01); *H01L 35/10* (2013.01); *H01L 35/30* (2013.01)
(58) Field of Classification Search
  CPC .......... H01L 35/32; H01L 35/10; H01L 35/30
  See application file for complete search history.

(56) References Cited

U.S. PATENT DOCUMENTS

| 3,282,267 | A | * | 11/1966 | Eidus | ........................ A61F 7/00 248/586 |
|---|---|---|---|---|---|
| 9,145,812 | B2 | | 9/2015 | An et al. | |
| 2003/0084935 | A1 | | 5/2003 | Bell | |
| 2005/0061473 | A1 | | 3/2005 | Fletcher et al. | |
| 2005/0121065 | A1 | * | 6/2005 | Otey | ....................... H01L 35/30 136/205 |
| 2010/0101236 | A1 | * | 4/2010 | Shah | ....................... F25B 21/02 62/3.2 |

(Continued)

FOREIGN PATENT DOCUMENTS

| JP | 2000-171181 A | 6/2000 |
|---|---|---|
| JP | 2001-214851 A | 8/2001 |

(Continued)

OTHER PUBLICATIONS

Notice of Allowance dated Dec. 28, 2016 for the corresponding Korean Application No. KR 10-2015-0128440.

*Primary Examiner* — Tae-Sik Kang
(74) *Attorney, Agent, or Firm* — Mintz Levin Cohn Ferris Glovsky and Popeo, P.C.; Peter F. Corless

(57) ABSTRACT

A thermoelectric module mounted on a non-flat surface of a heating source component to reduce thermal resistance to enhance thermoelectric generation efficiency is provided. The thermoelectric module includes at least one electrode component having a first electrode plate and a second electrode plate connected to be pivoted with respect to each other. Additionally, least one semiconductor component includes a first semiconductor element electrically connected to the first electrode plate and a second semiconductor element electrically connected to the second electrode plate.

5 Claims, 6 Drawing Sheets

(56) References Cited

U.S. PATENT DOCUMENTS

2013/0213448 A1* 8/2013 Moczygemba ......... H01L 35/30
                                                                     136/201
2015/0214460 A1   7/2015 Kanno et al.
2015/0303366 A1  10/2015 Yoshimi et al.

FOREIGN PATENT DOCUMENTS

| | | |
|---|---|---|
| JP | 2011-091243 A | 5/2011 |
| JP | 5228160 B2 | 7/2013 |
| JP | 2014-057211 A | 3/2014 |
| JP | 2014-075551 A | 4/2014 |
| JP | 2014-103246 A | 6/2014 |
| JP | 2014-138135 A | 7/2014 |
| JP | 5715739 B2 | 5/2015 |
| KR | 10-2013-0066061 A | 6/2013 |

\* cited by examiner

THERMOELECTRIC MODULE

CROSS-REFERENCE TO RELATED APPLICATION

This application is based on and claims the benefit of priority to Korean Patent Application No. 10-2015-0128440, filed on Sep. 10, 2015, in the Korean Intellectual Property Office, the disclosure of which is incorporated herein in its entirety by reference.

TECHNICAL FIELD

The present disclosure relates to a thermoelectric module and, more specifically, to a thermoelectric module mounted on a non-flat surface (e.g., a curved surface of an uneven surface) of a heating source component to reduce thermal resistance to enhance thermoelectric generation efficiency.

BACKGROUND

Generally, a thermoelectric module is used in a thermoelectric generation system having a seebeck effect generating electromotive force using a temperature difference between of both surfaces thereof. When thermoelectric generation is performed by the thermoelectric module, an amount of output of thermoelectric generation may be increased by maintaining a significant difference in temperature between a high temperature component and a low temperature component. For example, a heat transfer coefficient of heat transmitted from a heat source to the thermoelectric module significantly impacts the amount of output of the thermoelectric generation.

Further, a related thermoelectric module has a flat structure, and when a surface of a heat source on which the thermoelectric module is mounted is not flat (e.g., curved or uneven), a heat spreader or a thermal paste is applied to the uneven surface. In particular, the spreader or the thermal paste is applied to the heat source to make the surface flat and the thermoelectric module is subsequently attached thereto. However, the thermal resistance is increased due to the heat spreader or the thermal paste to lower a temperature of the high temperature component of the thermoelectric module. In particular, a temperature difference in the thermoelectric module is reduced, and the amount of output of thermoelectric generation is substantially reduced.

In an effort to overcome such shortcomings, the thermoelectric module having a structure in which an N type element, a P type element, an insulating plate, and an electrode of the thermoelectric module are formed to correspond to the uneven surface of the heat source component may be applied. However manufacturing a thermoelectric module may prove difficult and manufacturing cost thereof may increase.

SUMMARY

An exemplary embodiment of the present disclosure provides a thermoelectric module in which adjacent elements are relatively pivoted to be mounted on a non-flat surface of a heat source component. Additionally, a thermal resistance of a high temperature component may be reduced to increase a difference in temperature between the high temperature component and a low temperature component, thus increasing an amount of output of thermoelectric generation.

According to an exemplary embodiment of the present disclosure, a thermoelectric module may include at least one electrode component having a first electrode plate and a second electrode plate connected to be relatively pivoted with respect to each other. Further at least one semiconductor part may have a first semiconductor element electrically connected to the first electrode plate and a second semiconductor element electrically connected to the second electrode plate.

In an exemplary embodiment, the first electrode plate and the second electrode plate may be connected to be relatively pivoted with respect to each other by a pivot component. The pivot component may include a first pivot lug that protrudes from the first electrode plate, a second pivot lug protruding from that protrudes from the second electrode plate, and a pivot pin that penetrates through the first pivot lug and the second pivot lug. The pivot pin may extend along an axial line parallel to any one axis of a rectangular coordinate system. In addition, the pivot pin may extend along an axial line parallel to any one axis on a horizontal plane. The pivot pin may extend along an axial line parallel to an axis perpendicular to the horizontal plane. The pivot component may include a ball-socket joint portion.

The thermoelectric module may further include a cooling pipe that penetrates through the at least one semiconductor part. The cooling pipe may be penetrate through the first semiconductor element and the second semiconductor element of the at least one semiconductor part. Further, a cooling medium may pass through an interior of the cooling pipe. The cooling pipe may penetrate through the first semiconductor element and the second semiconductor element of the at least one semiconductor component having a substantially S shape (e.g., or similar geometry).

According to another exemplary embodiment, a thermoelectric module may include a plurality of electrode components each having a first electrode plate and a second electrode plate that may be connected to be pivoted with respect to each other. A plurality of semiconductor components may include a first semiconductor element electrically connected to the first electrode plate and a second semiconductor element electrically connected to the second electrode plate. A cooling pipe may penetrate through the plurality of semiconductor components having a substantially S shape, wherein the cooling pipe may be formed of an insulating material.

The cooling pipe may have an insertion portion that may be inserted into the first and second semiconductor elements of the plurality of semiconductor components and an exposure portion exposed to the exterior of the first and second semiconductor elements of the plurality of semiconductor components. A conductive layer may be formed on an exterior surface of a partial section of the exposure portion and may electrically connect adjacent partial sections of the plurality of semiconductor components.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
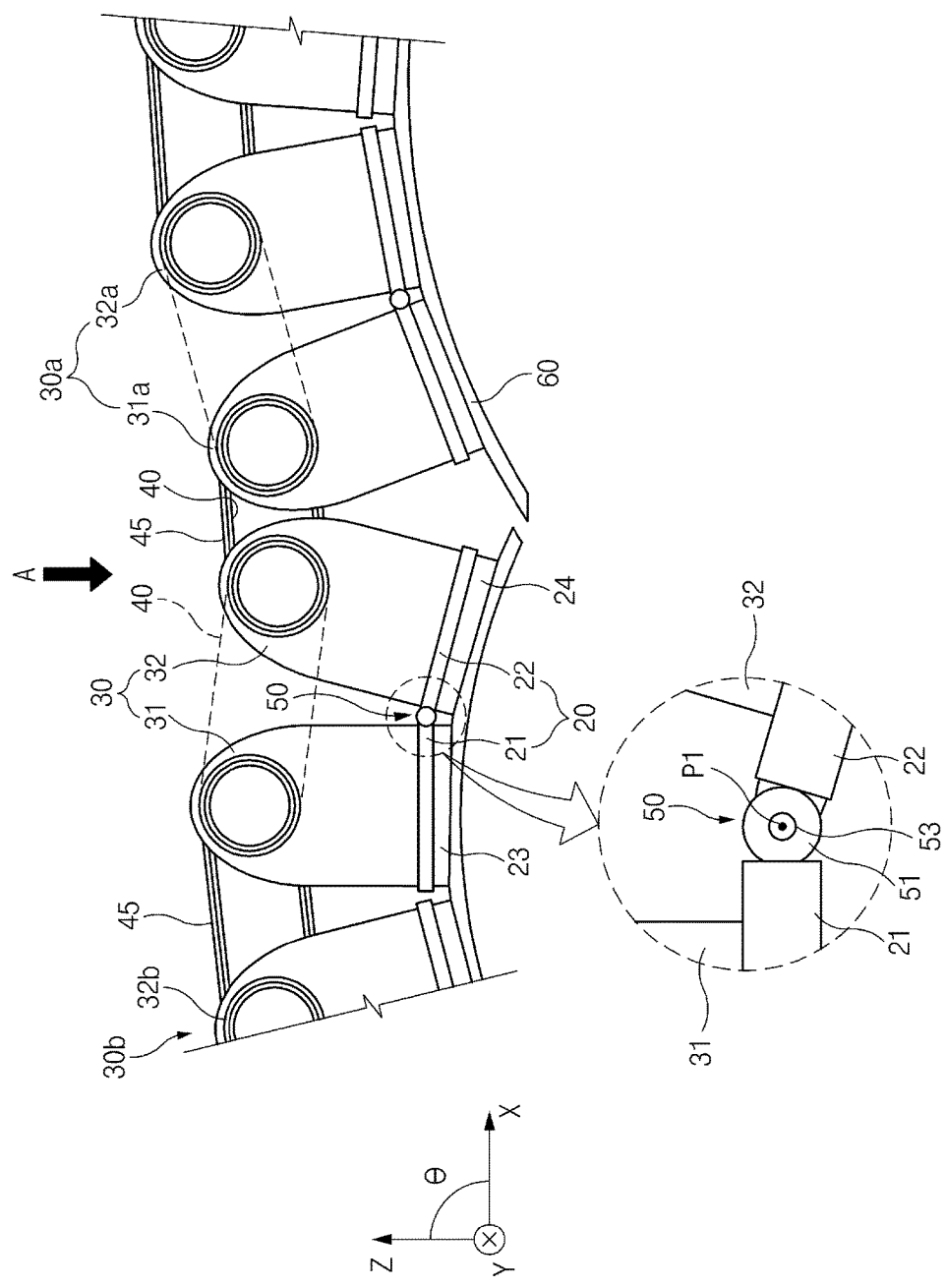
FIG. 1 is an exemplary front cross-sectional view illustrating a thermoelectric module according to an exemplary embodiment of the present disclosure.

While the present disclosure will be described in conjunction with exemplary embodiments thereof with reference to the accompanying drawings, the present description is not intended to limit the present invention to those exemplary embodiments. On the contrary, the invention is intended to cover not only the exemplary embodiments, but also various alternatives, modifications, equivalents and other embodiments, which may be included within the spirit and scope of the invention as defined by the appended claims. Throughout the drawings, the same reference numerals will refer to the same or like parts. Thus, components may be described with reference to several drawings It is understood that the term "vehicle" or "vehicular" or other similar term as used herein is inclusive of motor vehicle in general such as passenger automobiles including sports utility vehicles (SUV), buses, trucks, various commercial vehicles, watercraft including a variety of boats, ships, aircraft, and the like and includes hybrid vehicles, electric vehicles, combustion, plug-in hybrid electric vehicles, hydrogen-powered vehicles and other alternative fuel vehicles (e.g. fuels derived from resources other than petroleum).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, in order to make the description of the present invention clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Figure 2:
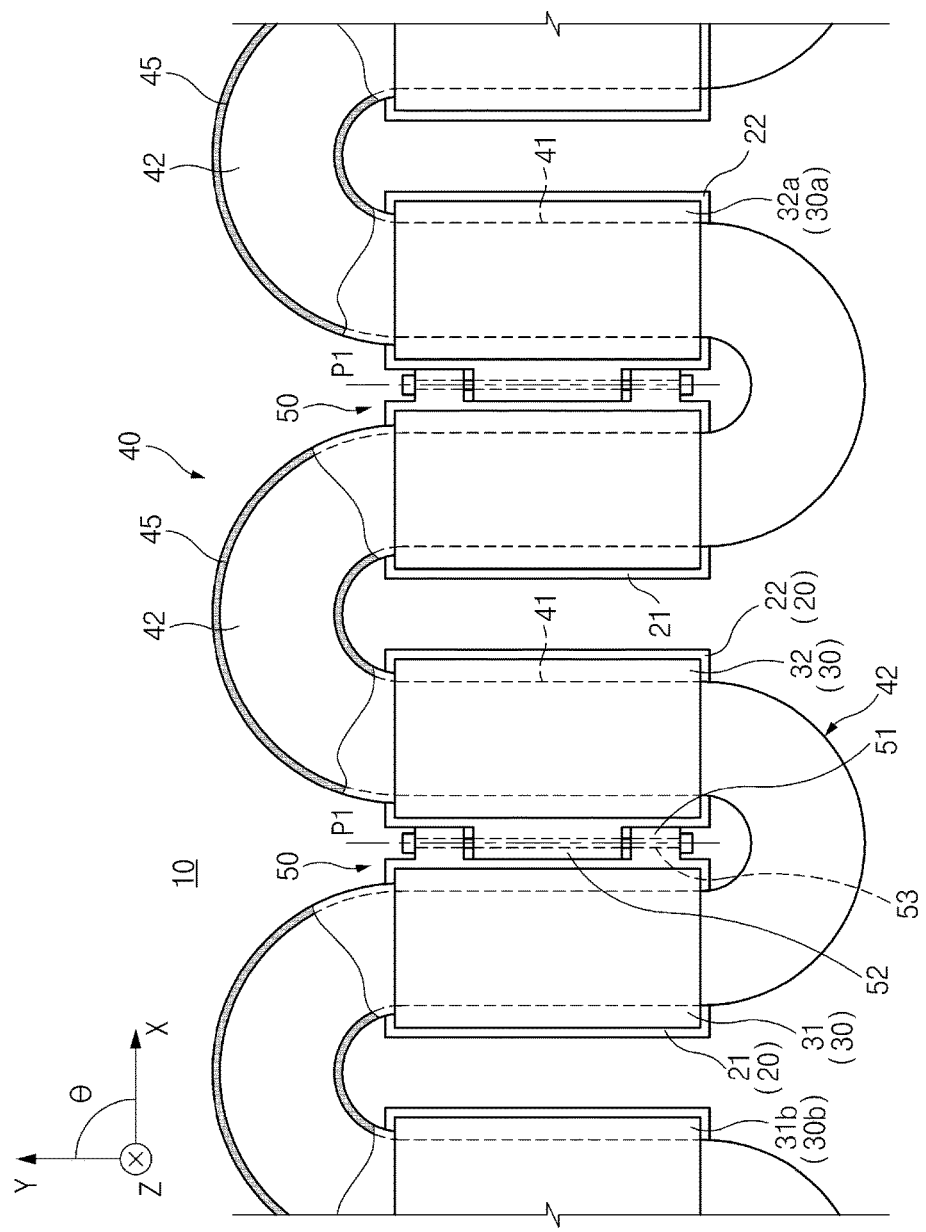
FIG. 2 is an exemplary plan view illustrated in a direction of the arrow 'A' of FIG. 1 according to an exemplary embodiment of the present disclosure.

FIGS. 1 and 2 are exemplary views illustrating a thermoelectric module according to an exemplary embodiment of the present disclosure. As illustrated in FIG. 1, the thermoelectric module according to the first exemplary embodiment of the present disclosure may include a plurality of electrode components 20, a plurality of semiconductor components 30 that may be electrically connected to the electrode components, and a cooling pipe 40 that may penetrate through the plurality of semiconductor components 30.

The electrode components 20 may include a first electrode plate 21 and a second electrode plate 22 that may be pivotably connected to each other by a pivot component 50. The first electrode plate 21 and the second electrode plate 22 may be formed of a conductive material. A first insulating plate 23 may be attached to a lower surface of the first electrode plate 21, and a second insulating plate 24 may be attached to a lower surface of the second electrode plate 22.

The pilot component 50 may include a first pivot lug 51 that may protrude from one side of the first electrode plate 21, a second pivot lug 52 that may protrude from one side of the second electrode plate 22, and a pivot pin 53 that may penetrate through the first pivot lug 51 and the second pivot lug 52. The first pivot lug 51 and the second pivot lug 52 may have an aperture allowing the pivot pin 53 to penetrate therethrough. The first pivot lug 51 and the second pivot lug 52 may be inserted with respect to each other to align the apertures thereof. The pivot pin 53 may penetrate through the apertures of the first pivot lug 51 and the second pivot lug 52 to be installed. The pivot pin 53 may extend along an axial line P1, and the axial line P1 of the pivot pin 53 may be formed to be parallel to a Y axis direction on a horizontal plane (X-Y plane) of a rectangular coordinate system of FIGS. 1 and 2. In other words, the pivot pin 53 of the present exemplary embodiment may be configured to extend in any one axis direction (e.g., X axis or Y axis direction) of the horizontal plane (X-Y plane).

Accordingly, a surface of a heat source component 60 may be a non-flat surface in which a height thereof in a Z-axis direction with respect to the horizontal plane (e.g., X-Y plane) may be uneven. The first and second electrode plates 21 and 22 may be pivoted with respect to each other by the pivot pin 53 as illustrated in FIG. 1, and may be mounted on the uneven surface of the heat source component 60. The pivot pin 53 may be formed of a conductive material and may electrically connect the first electrode plate 21 and the second electrode plate 22.

The semiconductor components 30 may have a first semiconductor element 31 that may be connected to the first electrode plate 21 and a second semiconductor element 32 connected to the second electrode plate 22. According to an exemplary embodiment, the first semiconductor element 31 may be a P-type semiconductor element and the second semiconductor element 32 may be an N-type semiconductor element. Conversely, the first semiconductor element 31 may be an N-type semiconductor element and the second semiconductor element 32 may be a P-type semiconductor element.

The thermoelectric module according to an exemplary embodiment may include a cooling component configured to cool the semiconductor components 30, and the cooling component may include a cooling pipe 40 that penetrates through the semiconductor components 30. The cooling pipe 40 may be installed to penetrate through the first semiconductor elements 31 and the second semiconductor elements 32 of the semiconductor components 30, and may allow a cooling medium to pass through the interior thereof.

The cooling pipe 40 may penetrate through the first semiconductor element 31 and the second semiconductor element 32 of each of the semiconductor components 30 in a substantially "S" shape, thus connecting the plurality of semiconductor components 30 in the "S" shape. Accordingly, a cooling structure may be formed with respect to the plurality of semiconductor components 30. In particular, since the cooling pipe 40 may penetrate through the plurality of semiconductor components 30, the cooling pipe 40 may include an insertion portion 41 that may be inserted into the interior of the first and second semiconductor elements 31 and 32 of the semiconductor components 30 and an exposure portion 42 that may be subjected to the exterior of the semiconductor components 30.

For example, the cooling pipe 40 may penetrate through upper portions of the first and second semiconductor elements 31 and 32, and thus, the cooling pipe 40 may form a cooling component spaced apart from the heat source component 60. Additionally, since the cooling pipe 40 penetrates through the upper portions of the first and second semiconductor elements 31 and 32, a low temperature component may be realized. The cooling pipe 40 may be formed of an insulating material to insulate both an exterior surface and interior surface thereof.

A conductive layer 45 may be formed on an exterior surface of a partial section of the exposure portion 42 and may electrically connect the semiconductor elements having the opposite polarities of a pair of adjacent semiconductor components 30 and 30a. For example, as illustrated in FIGS. 1 and 2, the conductive layer 45 may electrically connect the first semiconductor element 31 of one semiconductor component 30 and a second semiconductor element 32b of a semiconductor component 30b that may be positioned on the left, and electrically connect the second semiconductor element 32 of one semiconductor component 30 and a first semiconductor element 31a of a semiconductor component 30a that may be positioned on the right.

According to an exemplary embodiment, as illustrated in FIGS. 1 and 2, the first semiconductor element 31 may be configured as an N-type semiconductor element, and the second semiconductor element 32 may be configured as a P-type semiconductor element. A current may flow from the first semiconductor element (e.g., N type) to the second semiconductor element (e.g., P type) through the first electrode plate 21, the second electrode plate 22, and the pivot component 50 in one semiconductor component 30. The current may flow from the second semiconductor element (e.g., P type) of one semiconductor component 30 to the first semiconductor element (e.g., N type) of another semiconductor component 30a through the conductive layer 45 of the cooling pipe 40 among the adjacent semiconductor components 30, 30a, and 30b. Additionally, the conductive layer 45 of the present exemplary embodiment may correspond to an upper electrode pad of the related art thermoelectric module and the electrode component 20 of the present disclosure may correspond to the lower electrode pad of the related art thermoelectric module.

Figure 3:
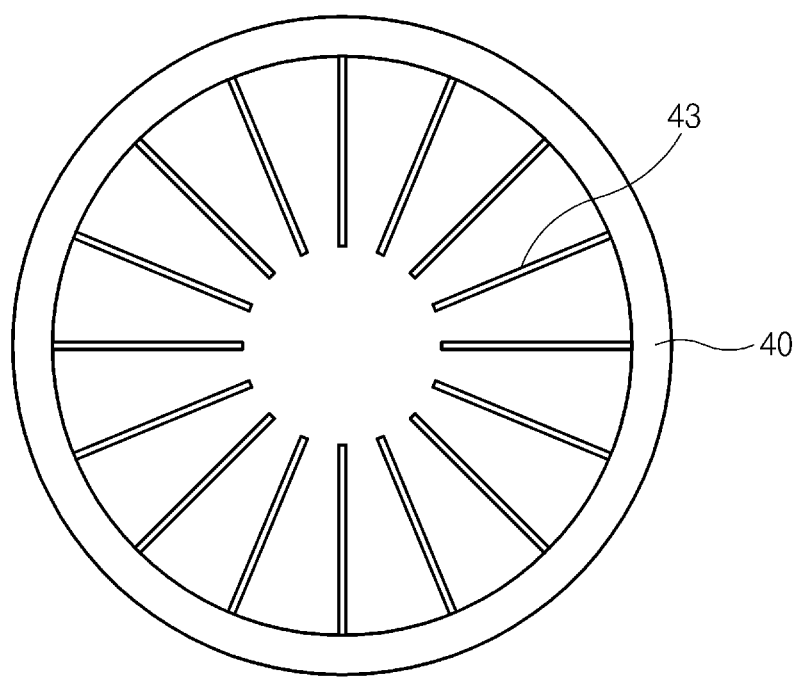
FIG. 3 is an exemplary cross-sectional view illustrating the interior of a cooling pipe of the thermoelectric module according to an exemplary embodiment of the present disclosure.

As illustrated in FIG. 3, cooling pins 43 may be formed on an interior surface of the cooling pipe 40 in order to enhance cooling efficiency.

Figure 4:
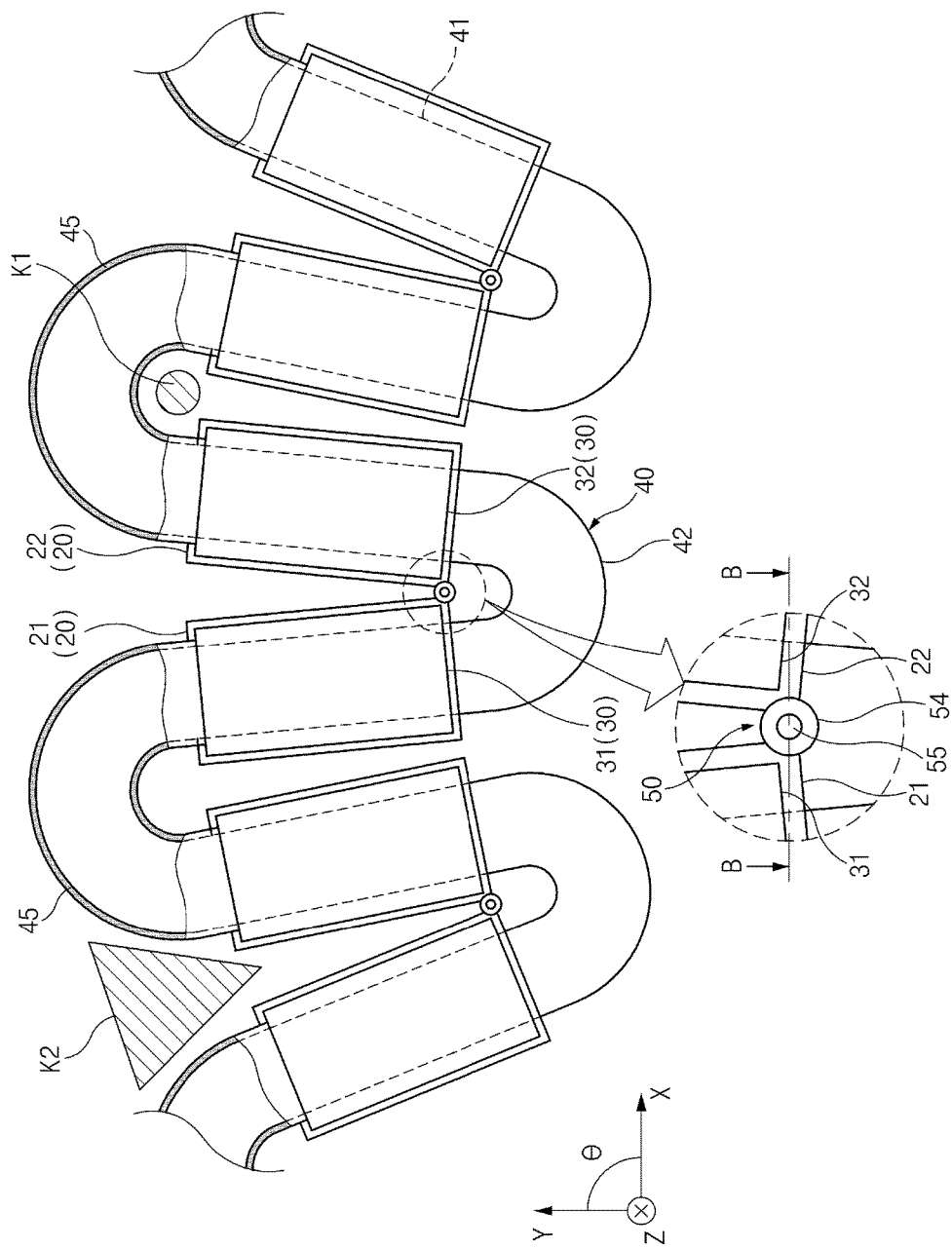
FIG. 4 is an exemplary plan view illustrating a thermoelectric module according to an exemplary embodiment of the present disclosure.
Figure 5:
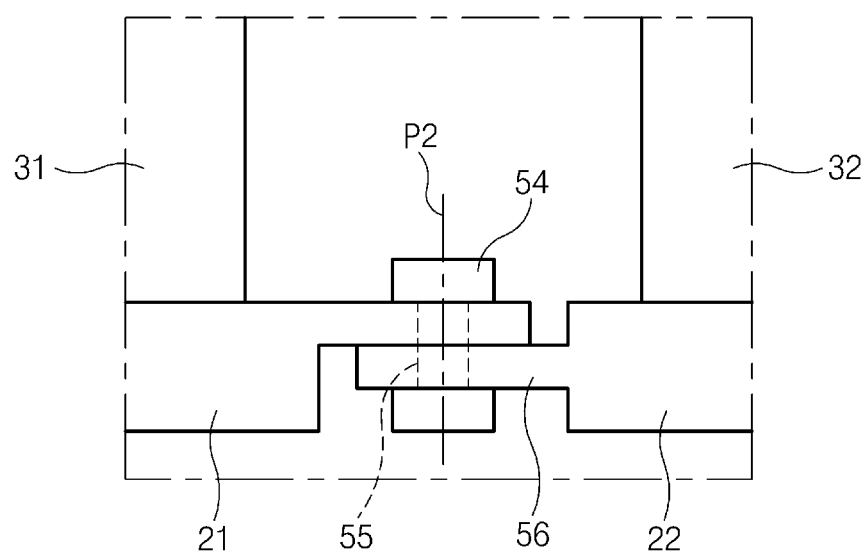
FIG. 5 is an exemplary cross-sectional view illustrated along line B-B of FIG. 4 according to an exemplary embodiment of the present disclosure.
Figure 6:
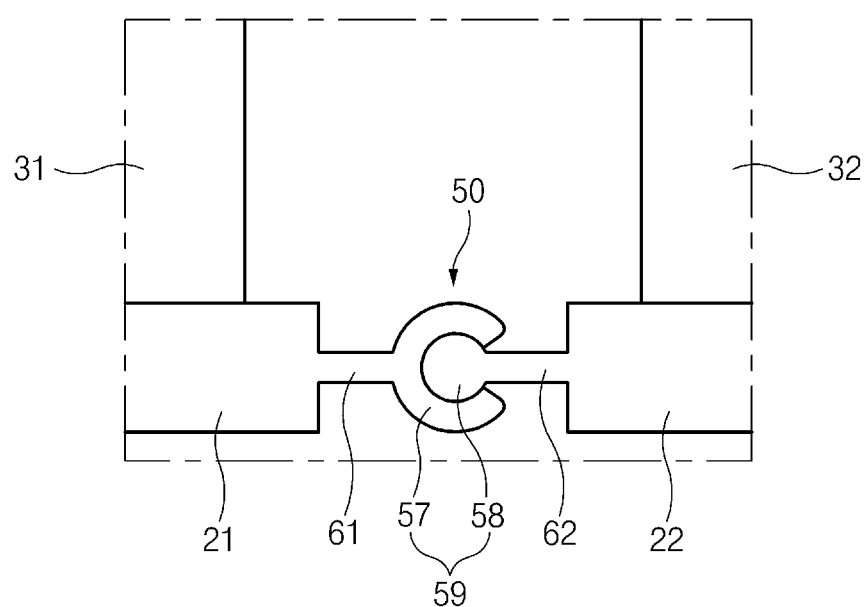
FIG. 6 is an exemplary view illustrating a pivot component of a thermoelectric module according to an exemplary embodiment of the present disclosure.

FIGS. 4 and 5 are exemplary views illustrating a thermoelectric module according to an exemplary embodiment. As illustrated in FIG. 4, a pivot component 50 may include a first pivot lug 54 that protrudes from one side of the first electrode component 21, a second pivot lug 56 that protrudes from one side of the second electrode component 22, and a pivot pin 55 that penetrates through the first pivot lug 54 and the second pivot lug 56.

The first pivot lug 54 and the second pivot lug 56 may each have an aperture that allows the pivot pin 55 to penetrate therethrough, and the first pivot lug 54 and the second pivot lug 56 may be inserted to each other to align the apertures thereof. The pivot pin 55 may be installed to penetrate through the apertures of the first pivot lug 54 and the second pivot lug 56. The pivot pin 55 may extend along an axial line P2. Further, the axial line P2 of the pivot pin 55 may be formed to be parallel to the Z-axis direction on a rectangular coordinate system of FIG. 4. In other words, the pivot pin 55 of the second exemplary embodiment may extend along the axial line P2 parallel to the axial direction (e.g., Z axis direction) perpendicular to the horizontal plane (e.g., X-Y plane).

Accordingly, the first electrode plate 21 and the second electrode plate 22 may be relatively pivoted with respect to each other on the horizontal plane (e.g., X-Y plane) of the rectangular coordinate system of FIG. 4 based on the axial line P2 of the pivot pin 55. Thus, when one or more obstacles K1 and K2 are present on the horizontal plane (e.g., X-Y plane) of the heat source component 60, the first electrode plate 21 and the second electrode plate 22 may be installed to appropriately avoid the obstacles K1 and K2. Other components are the same or similar to those of the previous exemplary embodiment, and thus, a detailed description thereof will be omitted.

In the aforementioned exemplary embodiment, the pivot component 50 may have the pivot pins 53 and 55 respectively having the axial lines P1 and P2 parallel to any one axis (e.g., Y axis or Z axis) on the rectangular coordinate system. Additionally, the pivot component 50 according to an exemplary embodiment of the present disclosure may have a first extending portion 61 that extends from one side of the first electrode plate 21, a second extending portion 62 that extends from one side of the second electrode plate 22, and a ball-socket joint portion 59 that may be disposed between the mutually adjacent end portions of the first extending portion 61 and the second extending portion 62. The ball-socket joint portion 59 may have a socket portion 57 integrally formed with the first extending portion 61 and a joint ball 58 integrally formed with the second extending portion 62. The first electrode plate 21 and the second electrode plate 22 may be pivoted freely in any direction by the pivot component 50 including the ball-socket joint portion 59. The first electrode plate 21 and the second electrode plate 22 may effectively accommodate the various non-flat surfaces of the heat source component 60. Other components and operations are the same as those of the previous exemplary embodiment, and thus, a detailed description thereof will be omitted.

According to an exemplary embodiment of the present disclosure, adjacent elements may be relatively pivoted to be mounted on a non-flat surface of a heat source part. The thermal resistance of a high temperature component may thus be reduced to increase a difference in temperature between the high temperature component and a low temperature part, increasing an amount of output of thermoelectric generation.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims. In addition, it is to be considered that all of these modifications and alterations fall within the scope of the present invention.

What is claimed is:

1. A thermoelectric module, comprising:
   at least one electrode component having a first electrode plate and a second electrode plate connected to be pivoted with respect to each other;
   at least one semiconductor component having a first semiconductor element electrically connected to the first electrode plate and a second semiconductor element electrically connected to the second electrode plate; and
   a cooling pipe installed to penetrate directly through the first semiconductor element and the second semiconductor element of the at least one semiconductor component, and a cooling medium passes through an interior of the cooling pipe, wherein the cooling pipe directly contacts the first semiconductor element and the second semiconductor element
   wherein the first electrode plate and the second electrode plate are connected to be pivoted with respect to each other by a pivot component,
   wherein the pivot component includes a first pivot lug that protrudes from the first electrode plate, a second pivot lug that protrudes from the second electrode plate, and a pivot pin installed to penetrate through the first pivot lug and the second pivot lug, and
   wherein the pivot pin is formed of a conductive material.

2. The thermoelectric module according to claim 1, wherein the pivot pin extends along an axial line parallel to any one axis of a rectangular coordinate system.

3. The thermoelectric module according to claim 1, wherein the pivot pin extends along an axial line parallel to an axis perpendicular to a horizontal plane of a rectangular coordinate system.

4. The thermoelectric module according to claim 1, wherein the pivot component includes a ball-socket joint portion.

5. The thermoelectric module according to claim 1, wherein the cooling pipe penetrates through the first semiconductor element and the second semiconductor element of the at least one semiconductor component in an S shape.

* * * * *